(12) United States Patent
Chua

(10) Patent No.: US 7,257,141 B2
(45) Date of Patent: Aug. 14, 2007

(54) PHASE ARRAY OXIDE-CONFINED VCSELS

(75) Inventor: Christopher L. Chua, San Jose, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 168 days.

(21) Appl. No.: 10/625,811

(22) Filed: Jul. 23, 2003

(65) Prior Publication Data

US 2005/0019973 A1    Jan. 27, 2005

(51) Int. Cl.
*H01S 5/00*    (2006.01)
(52) U.S. Cl. .............................. 372/46.013; 372/46.014
(58) Field of Classification Search .................. 372/18, 372/45.012, 92, 46.01
See application file for complete search history.

(56) References Cited

U.S. PATENT DOCUMENTS

| | | | |
|---|---|---|---|
| 4,144,101 | A | 3/1979 | Rideout |
| 4,870,652 | A | 9/1989 | Thornton |
| 4,980,893 | A | 12/1990 | Thornton et al. |
| 5,073,041 | A | 12/1991 | Rastani |
| 5,115,442 | A | 5/1992 | Lee et al. |
| 5,126,875 | A | 6/1992 | Tabuchi |
| 5,171,703 | A | 12/1992 | Lin et al. |
| 5,179,567 | A | 1/1993 | Uomi et al. |
| 5,245,622 | A | 9/1993 | Jewell et al. |
| 5,258,990 | A | 11/1993 | Olbright et al. |
| 5,262,491 | A | 11/1993 | Jain et al. |
| 5,331,654 | A | 7/1994 | Jewell et al. |
| 5,337,074 | A | 8/1994 | Thornton et al. |
| 5,354,709 | A | 10/1994 | Lorenzo et al. |
| 5,400,354 | A | 3/1995 | Ludowise et al. |
| 5,412,680 | A | 5/1995 | Swirhun et al. |
| 5,416,044 | A | 5/1995 | Chino et al. |
| 5,557,627 | A | 9/1996 | Schneider, Jr. et al. |
| 5,568,499 | A | 10/1996 | Lear |
| 5,581,571 | A | 12/1996 | Holonyak, Jr. et al. |

(Continued)

FOREIGN PATENT DOCUMENTS

EP    0 858 137 A3    4/2000

(Continued)

OTHER PUBLICATIONS

Deppe, D.G., et al: Phase-coupled two-dimensional AlGaAsGaAs vertical-cavity surface-emitting laser array, Applied Physics Letters, American Institute of Physics, May 21, 1990, pp. 2089-2091, vol. 56, No. 21.*

(Continued)

*Primary Examiner*—Minsun Oh Harvey
*Assistant Examiner*—Tuan N. Nguyen
(74) *Attorney, Agent, or Firm*—Kent Chen

(57) ABSTRACT

A phase array of oxide confined VCSELs and a method for forming the phase array of oxide confined VCSELs is described. VCSELs in the array are designed to be simultaneously addressed such that the output of multiple VCSELs can be used to increase the light intensity at a point. In applications where beam coherence from the VCSEL array is desirable, high gain coupling regions break the continuity of the oxide wall surrounding each VCSEL aperture. The high gain coupling regions connect adjacent VCSELs in the VCSEL array thereby allowing mode coupling between adjacent lasers and the output of a coherent beam of light.

31 Claims, 8 Drawing Sheets

U.S. PATENT DOCUMENTS

| | | | |
|---|---|---|---|
| 5,594,751 A | | 1/1997 | Scott |
| 5,600,483 A | * | 2/1997 | Fan et al. .................. 359/245 |
| 5,633,527 A | | 5/1997 | Lear |
| 5,659,193 A | | 8/1997 | Ishigaki |
| 5,717,533 A | | 2/1998 | Poplawski et al. |
| 5,727,014 A | | 3/1998 | Wang et al. |
| 5,734,588 A | | 3/1998 | Rose et al. |
| 5,739,945 A | | 4/1998 | Tayebati |
| 5,809,051 A | | 9/1998 | Oudar |
| 5,864,468 A | | 1/1999 | Poplawski et al. |
| 5,870,132 A | | 2/1999 | Inoue et al. |
| 5,881,085 A | | 3/1999 | Jewell |
| 5,896,408 A | * | 4/1999 | Corzine et al. ........ 372/46.013 |
| 5,897,329 A | | 4/1999 | Jewell |
| 5,903,588 A | | 5/1999 | Guenter et al. |
| 5,903,589 A | | 5/1999 | Jewell |
| 5,978,408 A | * | 11/1999 | Thornton ..................... 372/96 |
| 6,014,395 A | | 1/2000 | Jewell |
| 6,052,399 A | | 4/2000 | Sun |
| 6,069,908 A | | 5/2000 | Yuen et al. |
| 6,075,804 A | | 6/2000 | Deppe et al. |
| 6,148,016 A | | 11/2000 | Hegblom et al. |
| 6,201,704 B1 | | 3/2001 | Poplawski et al. |
| 6,208,681 B1 | * | 3/2001 | Thornton ..................... 372/96 |
| 6,269,109 B1 | | 7/2001 | Jewell |
| 6,297,068 B1 | | 10/2001 | Thornton |
| 6,304,588 B1 | * | 10/2001 | Chua et al. ............ 372/46.013 |
| 6,459,719 B1 | | 10/2002 | Johnson |
| 6,548,908 B2 | * | 4/2003 | Chua et al. ................. 257/773 |
| 6,560,006 B2 | * | 5/2003 | Sigalas et al. ............. 359/321 |
| 6,674,090 B1 | * | 1/2004 | Chua et al. ................... 257/13 |
| 6,731,843 B2 | * | 5/2004 | Murali ........................ 385/50 |
| 6,734,453 B2 | * | 5/2004 | Atanackovic et al. ......... 257/19 |
| 6,765,943 B2 | | 7/2004 | Jewell |
| 6,822,993 B2 | * | 11/2004 | Lee et al. ............. 372/46.015 |
| 6,959,027 B1 | * | 10/2005 | Guilfoyle et al. ............. 372/18 |
| 2001/0028667 A1 | | 10/2001 | Kaneko |
| 2002/0097764 A1 | | 7/2002 | Jewell |
| 2004/0062284 A1 | | 4/2004 | Jewell |

FOREIGN PATENT DOCUMENTS

| | | |
|---|---|---|
| EP | 1 225 669 A1 | 7/2002 |
| JP | 10-065266 | 3/1998 |
| JP | 10-125999 | 5/1998 |
| JP | 10-229248 | 8/1998 |
| WO | WO 02/89272 A1 | 4/2002 |

OTHER PUBLICATIONS

Huffaker, D.L., et al.: Fabrication of High-Packing-Density Vertical Cavity Surface-Emitting Laser Arrays Using Selective Oxidation, IEEE Photonics Technology Letters, IEEE, Inc., May 1, 1996, pp. 596-598, vol. 8., No. 5.*

Deppe, D.G., et al: Phase-coupled two-dimensional AlGaAsGaAs vertical-cavity surface-emitting laser array, Applied Physics Letters, American Institute of Physics, May 21, 1990, pp. 2089-2091, vol. 56, No. 21.*

Huffaker, D.L., et al.: Fabrication of High-Packing-Density Vertical Cavity Surface-Emitting Laser Arrays Using Selective Oxidation, IEEE Photonics Technology Letters, IEEE, Inc., May 1, 1996, pp. 596-598, vol. 8., No. 5.*

Huffaker, D. L., et al.: Fabrication of High-Packing-Density Vertical Cavity Surface-Emitting Laser Arrays Using Selective Oxidation, IEEE Photonics Technology Letters, IEEE, Inc. , May 1, 1996, pp. 596-598, vol. 8., No. 5.

Deppe, D. G., et al: Phase-Coupled two-Dimensional ALXGA1-XAS-GAAS Vertical-Cavity Surface-Emitting Laser Array, Applied Physics Letters, American Institute of Physics, May 21, 1990, pp. 2089-2091, vol. 56, No. 21.

D.L. Huffaker, et al.: Appl, Phys. Lett, vol. 65, No. 1 pp. 97-99, 1994.

G.R. Hadley: Optic Letters, vol. 20, No. 13, pp. 1483-1485, 1995.

S. Mukai, etal: Appl Phys. Lett. vol. 45, No. 8, pp. 834-835, 1984.

U.S. Appl. No. 09/552,568, filed Apr. 19, 2000, Jewell.

Hoi-Jun Yoo, et al., *Fabrication Of A Two-Dimensional Phased Array Of Vertical-Cavity Surface-Emitting Lasers*, Appl. Phys. Letters 56 (13), pp. 1198-1200, (Mar. 26, 1990).

Y. H. Lee, et al., *Deep-Red Continuous Wave Top-Surface-Emitting Vertical Cavity AlGaAs Superlattice Lasers*, IEEE Photonics Technology Letters, vol. 3 No. 2, pp. 108-109 (Feb. 1991).

C. J. Chang-Hasnain, et al. *Rastered, Uniformly Separated Wavelengths Emitted From A Two-Dimensional Vertical-Cavity Surface-Emitting Laser Array*, Appl. Phys. Letters 58 (1) pp. 31-33 (Jan. 7, 1991).

Fumio Koyama, et al., *GaAs Surface Emitting Lasers With Circular Buried Heterostructure Grown By Metalorganic Chemical Vapor Deposition And Two=Dimensional Laser Array*, Appl. Phys. Letters 52 (7) pp. 528-529 (Feb. 15, 1988).

Jan P. Van Der Ziel, et al. *Characteristics Of A Single- And Two-Dimensional Phase Coupled Arrays Of Vertical Cavity Surface Emitting GaAs-AlGaAs Lasers*, IEEE Journal of Quantum Electronics, vol. 26, No. 11, pp. 1878-1882 (Nov. 1990).

J. L. Jewell, et al., *Surface-Emitting Microlasers For Photonic Switching And Interchip Connections*, Optical Engineering, vol. 29, No. 3, pp. 210-214, (Mar. 1990).

J. Buus, et al., *Surface-Emitting Two-Dimensional Coherent Semiconductor Laser Array*, Apl. Physics Letters 55 (4), pp. 331-333 (Jul. 24, 1989).

N. W. Carlson, et al., *Phase-Locked Operation Of A Grating-Surface-Emitting Diode Laser Array*, Appl. Phys. Letters 50 (19) pp. 1301-1303 (May 1, 1987).

M. H. Er, *Matrix Addressable Vertical Cavity Surface Emitting Laser Array*, Electronics Letters, vol. 27, No. 5 pp. 437-438 (Feb. 28, 1991).

A.R. Sugg et al., *Native Oxide-Embedded $Al_yGa_{1-y}As$-GaAs-$In_xGa_{1-x}As$ Quantum Well Heterostructure Lasers*, Appl. Phys. Lett. 62(11) 1259 (Mar. 15, 1993).

B.J. Thibeault et al., *Reduced Optical Scattering Loss in Vertical-Cavity Lasers Using a Thin (300 Å) Oxide Aperture*, IEEE Photonics Tech. Lett. 8(5) 593 (May 1996).

C.L. Chua et al., *Low-Threshold 1.57-μm VC-SEL's Using Strain-Compensated Quantum Wells and Oxide.Metal Backmirror*, IEEE Photonics Tech. Lett. 7(5) 444 (May 1995).

D.G. Deppe et al., *Atom Diffusion and Impurity-Induced Layer Disordering in Quantum Well III-V Semiconductor Heterostructures*, J. Appl. Phys. 64(12) R93 (Dec. 15, 1988).

D.G. Deppe et al., *Very-Low-Threshold Index-Confined Planar Microcavity Lasers*, IEEE Photonics Tech. Lett. 7(9) 965 (Sep. 1995).

D.L. Huffaker et al., *Improved Mode Stability in Low Threshold Single Quantum Well Native-Oxide Defined Vertical-Cavity Lasers*, Appl. Phys. Lett. 65(21) 2642 (Nov. 21, 1994).

D.L. Huffaker et al., *Lasing Characteristics of Low Threshold Microcavity Lasers Using Half-Wave Spacer Layers and Lateral Index Confinement*, Appl. Phys. Lett. 66(14) 1723 (Apr. 3, 1995).

D.L. Huffaker et al., *Low-Threshold Half-Wave Vertical-Cavity Lasers*, Elec. Lett. 30(23) 1946 (Nov. 10, 1994).

D.L. Huffaker et al., *Native-Oxide Defined Ring Contact for Low-Threshold Vertical-Cavity Lasers*, Appl. Phys. Lett. 65(1) 97 (Jul. 4, 1994).

D.L. Huffaker et al., *Spontaneous Coupling to Planar and Index-Confined Quasimodes of Fabry-Perot Microcavities*, Appl. Phys. Lett. 67(18) 2595 (Oct. 30, 1995).

D.L. Huffaker et al., *Threshold Characteristics of Planar and Index-Guided Mircocavity Lasers*, Appl. Phys. Lett. 67(1) 4 (Jul. 3, 1995).

E.R. Hegblom et al., *Estimation of Scattering Losses in Dielectrically Apertured Vertical Cavity Lasers*, Appl. Phys. Lett. 68(13) 1757 (Mar. 25, 1996).

F. Koyoma et al., *Wavelength Control of Vertical Cavity Surface-Emitting Lasers by Using Nonplanar MOCVD*, IEEE Photonics Tech. Lett. 7(1) 10 (Jan. 1995).

F.A. Kish et al., *Dependence on Doping Type (p/n) of the Water Vapor Oxidation of High-Gap $Al_xGa_{1-x}As$*, Appl. Phys. Lett. 60(25) 3165 (Jun. 22, 1992).

F.A. Kish et al., *Low-Threshold Disorder-Defined Native-Oxide Delineated Buried-Heterostructure $Al_xGa_{1-x}As$-GaAs Quantum Well Lasers*, Appl. Phys. Lett. 58(16) 1765 (Apr. 22, 1991).

F.A. Kish et al., *Native-Oxide Stripe-Geometry $In_{0.5}(Al_xGa_{1-x})_{0.5}P$-$In_{0.5}Ga_{0.5}P$ Heterostructure Laser Diodes*, Appl. Phys. Lett. 59(3) 354 (Jul. 19, 1991).

F.A. Kish et al., *Planar Native-Oxide $Al_xGa_{1-x}As$-GaAs Quantum Well Heterostructure Ring Laser Diodes*, Appl. Phys. Lett. 60(13) 1582 (Mar. 30, 1992).

G. Ronald Hadley et al., *Comprehensive Numerical Modeling of Vertical-Cavity Surface-Emitting Lasers*, IEEE J. Quantum Elec. 32(4) 607 (Apr. 1990).

G.M. Yang et al., *Ultralow Threshold Current Vertical-Cavity Surface-Emitting Lasers Obtained with Selective Oxidation*, Elec. Lett. 31(11) 886 (May 25, 1995).

Giorgio Giaretta et al., *A Novel 4×8 Single-Mode Independently Addressable Oxide-Isolated VCSEL Array*, IEEE Photonics Tech. Lett. 9(9) 1196 (Sep. 1997).

Gye Mo Yang et al., *Influence of Mirror Reflectivity on Laser Performance of Very-Low-Threshold Vertical-Cavity Surface-Emitting Lasers*, IEEE Photonics Tech. Lett. 7(11) 1228 (Nov. 1995).

H.Y. Chu et al., *Polarization Characteristics of Index-Guided Surface Emitting Lasers with Tilted Pillar Structure*, Elec. Lett. 9(8) 1066 (1997).

I. Babić Dubravko et al., *Room-Temperature Continuous-Wave Operation of 1.54-μm Vertical-Cavity Lasers*, IEEEE Photonics Tech. Lett. 7(11) 1225 (Nov. 1995).

J. Cibert et al., *Kinetics of Implantation Enhanced Interdiffusion of Ga and Al at $GaAs$-$Ga_xAl_{1-x}As$ Interfaces*, Appl. Phys. Lett. 49(4) 223 (Jul. 28, 1986).

J.M. Dallesasse et al., *Native-Oxide Masked Impurity-Induced Layer Disordering of $Al_xGa_{1-x}As$ Quantum Well Heterostructures*, Appl. Phys. Lett. 58(9) 974 (Mar. 4, 1991).

J.M. Dallesasse et al., *Native-Oxide Stripe-Geometry $Al_xGa_{1-x}As$-GaAs Quantum Well Heterostructure Lasers*, Appl. Phys. Lett. 58(4) 394 (Jan. 28, 1991).

J.M. Dallesasse et al., *Native-Oxide-Defined Coupled-Stripe $Al_xGa_{1-x}As$- GaAs Quantum Well Heterostructure Lasers*, Appl. Phys. Lett. 58(8) 834 (Feb. 25, 1991).

J.M. Dallesasse et al., *Stability of AlAs in $Al_xGa_{1-x}As$- GaAs Quantum Well Heterostructures*, Appl. Phys. Lett. 56(24) 2436 (Jun. 11, 1990).

Jack L. Jewell et al., *Surface-Emitting Lasers Break the Resistance Barrier*, Photonics Spectra (Nov. 1992).

K.D. Choquette et al., *Cavity Characteristics of Selectively Oxidized Vertical-Cavity Lasers*, Appl. Phys. Lett. 66(25) 3413 (Jun. 19, 1995).

K.D. Choquette et al., *Continuous Wave Operation of 640-660nm Selectively Oxidized AlGaInP Vertical-Cavity Lasers*, Elec. Lett. 31(14) 1145 (Jul. 6, 1995).

K.D. Choquette et al., Elec. Lett. 32(5) 459 (Feb. 29, 1996).

K.D. Choquette et al., *Fabrication and Performance of Selectively Oxidized Vertical-Cavity Lasers*, IEEE Photonics Tech. Lett. 7(11) 1237 (Nov. 1995).

K.D. Choquette et al., *Low Threshold Voltage Vertical-Cavity Lasers Fabricated by Selective Oxidation*, Elec. Lett. 30(24) 2043 (Nov. 24, 1994).

K.L. Lear et al., *High-Frequency Modulation of Oxide-Confined Vertical Cavity Surface Emitting Lasers*, Elec. Lett. 32(5) 457 (Feb. 29, 1996).

K.L. Lear et al., *Modal Analysis of a Small Surface Emitting Lasers with a Selectively Oxidized Waveguide*, Appl. Phys. Lett. 66(20) 2616 (May 15, 1995).

K.L. Lear et al., *Index Guiding Dependent Effects in Implant and Oxide Confined Vertical-Cavity Laser*, IEEE Photonics Tech. Lett., vol. 8, pp. 740-742, (Jun. 1996).

K.S. Giboney et al., *The Ideal Light Source for Datanets*, IEEE Spectrum 43 (Feb. 1998).

L.A. Coldren et al., *Dielectric Apertures as Intracavity Lenses in Vertical-Cavity Lasers*, Appl. Phys. Lett. 68(3) 313 (Jan. 15, 2996).

M. Ochlal et al., *Kinetics of Thermal Oxidation of AlAs in Water Vapor*, Appl. Phys. Lett. 68(14) 1898-1900 (Apr. 1, 1996).

M.R. Krames et al., *Buried-Oxide Ridge-Wavelength InAlAs-InP-InGaAsP (λ~1.3 μm) Quantum Well Heterostructure Laser Diodes*, Appl. Phys. Lett. 64(21) 2821 (May 23, 1994).

M.R. Krames et al., *Deep-Oxide Planar Buried-Heterostructure InAlAs-InP-InGaAsP (λ~1.3 μm) Quantum Well Heterostructure Laser Diodes*, Appl. Phys. Lett. 65(25) 3221 (Dec. 19, 1994).

Michael H. MacDougal et al., *Electrically-Pumped Vertical-Cavity Lasers with $Al_xO_y$-GaAs Reflectors*, IEEE Photonics Tech. Lett. 8(3) 310 (Mar. 1996).

Michael H. MacDougal et al., *Ultralow Threshold Current Vertical-Cavity Surface-Emitting Lasers with AlAs Oxide-GaAs Distributed Bragg Reflectors*, IEEE Photonics Tech. Lett. 7(3) 229 (Mar. 1995).

Michael H. MacDougal et al., *Wide-Bandwidth Distributed Bragg Reflectors Using Oxide/GaAs Multilayers*, Elec. Lett. 30(14) 1147 (Jul. 7, 1994).

N. El-Zein et al., *Native Oxide Coupled-Cavity $Al_xGa_{1-x}As$-GaAs Quantum Well Heterostructure Laser Diodes*, Appl. Phys. Lett. 59(22) 2838 (Nov. 25, 1991).

O. Blum et al., *Electrical and Optical Characteristics of AlAsSb/GaAsSb Distributed Bragg Reflectors for Surface Emitting Lasers*, Appl. Phys. Lett. 67(22) 3233 (Nov. 27, 2995).

P.D. Floyd et al., *Comparison of Optical Losses in Dielectric-Apertured Vertical-Cavity Lasers*, IEEE Photonics Tech. Lett. 8(5) 590 (May 1996).

P.D. Floyd et al., *Vertical Cavity Lasers*, Elec. Lett. 32(2) 114 (Jan. 18, 1996).

S.A. Maranowski et al., *$Al_xGa_{1-x}As$-$GaAs$-$In_yGa_{1-y}As$ Quantum Well Heterostructure Lasers with Native Oxide Current-Blocking Windows Formed on Metallized Devices*, Appl. Phys. Lett. 64(16) 2151 (Apr. 18, 1994).

S.A. Maranowski et al., *Native Oxide Top- and Bottom-Confined Narrow Stripe p-n $Al_yGa_{1-y}As$-$GaAs$-$In_xGa_{1-x}As$ Quantum Well Heterostructure Laser*, Appl. Phys. Lett. 63(12) 1660 (Sep. 20, 1993).

T.J. Rogers et al., *Influence of Cavity Tuning on the Transverse Mode in Vertical-Cavity Lasers*, IEEE Photonics Tech. Lett. 7(3) 238 (Mar. 1995).

Y. Hayashi et al., *Lasing Characteristics of Low-Threshold Oxide Confinement InGaAs-GaAlAs Vertical-Cavity Surface-Emitting Lasers*, IEEE Photonics Tech. Lett. 7(11) 560 (Nov. 1995).

Y. Hayashi et al., *Record Low-Threshold Index-Guided InGaAs/GaAlAs Vertical-Cavity Surface-Emitting Laser with a Native Oxide Confinement Structure*, Elec. Lett. 31(7) 560 (Mar. 30, 1995).

Y. Kobayashi et al., *Application of Selective Oxidation Structure to Common-Anode SEL*, Advance Compilation o Lectures of the 57th Scientific Lecture Meeting of the Society of Applied Physics vol. 3 p. 926 (No. 7p-KH-11) (Fall 1996) (with partial English-language translation).

Yong-Soo Lee et al., *Wet Oxidation of AlAs Grown by Molecular Beam.Epitaxy*, Appl. Phys. Lett. 65(21) 2717 (Nov. 21, 1994).

\* cited by examiner

PHASE ARRAY OXIDE-CONFINED VCSELS

BACKGROUND

The relative ease with which vertical cavity surface-emitting lasers (VCSELs) can be fabricated has resulted in the increasing use of VCSELs in a variety of applications such as printing, data storage and network communications. However, the small light emission area of each VCSEL severely limits the light output power that can be generated and output by each VCSEL. This shortcoming is especially severe in single mode devices. The narrow beam profile of single mode devices is highly desirable in a range of applications ranging from printing to wide area network communications.

One method of increasing the optic power at a target point is to align and simultaneously switch several lasers to form a composite beam. However, using an array of independent lasers results in each laser having its own independent intensity pattern. Combining independent intensity patterns results in a composite beam that appears as several distinct spots. These distinct spots are unsuitable for communications and printing applications where a central radiation lobe with a high concentration of power output is desired.

Thus an improved method of combining the output of an array of lasers, preferably VCSELs, to generate a single spot composite beam is needed.

SUMMARY OF THE INVENTION

The present invention relates generally to the field of laser fabrication. More particularly, a plurality of VCSELs are fabricated. A first VCSEL is at least partially surrounded by a first oxide wall and a second VCSEL is at least partially surrounded by a second oxide wall. A contact is structured to simultaneously provide power to both the first VCSEL and the second VCSEL. In one embodiment of the invention, a high gain coupling region couples the active region of the first VCSEL to the active region of the second VCSEL through a gap in the first oxide wall and a corresponding gap in the second oxide wall. The high gain coupling region enhances mode coupling between the first VCSEL and the second VCSEL.

BRIEF DESCRIPTION OF THE DRAWINGS

A more complete appreciation of the invention may be more readily understood by referring to the detailed description and the accompanying drawings.

DETAILED DESCRIPTION

In the following detailed description, a method and system of forming an array of VCSELs using laterally oxidized apertures will be described. A common contact addresses several VCSELs simultaneously. In one embodiment of the invention, the VCSELs will be closely spaced and separated by thin, laterally oxidized regions designed to promote mode leakage between adjacent VCSELs. The mode leakage keeps the output of adjacent VCSELs in phase thereby allowing the output of these adjacent VCSELs to be combined into a coherent composite beam.

Figure 1:
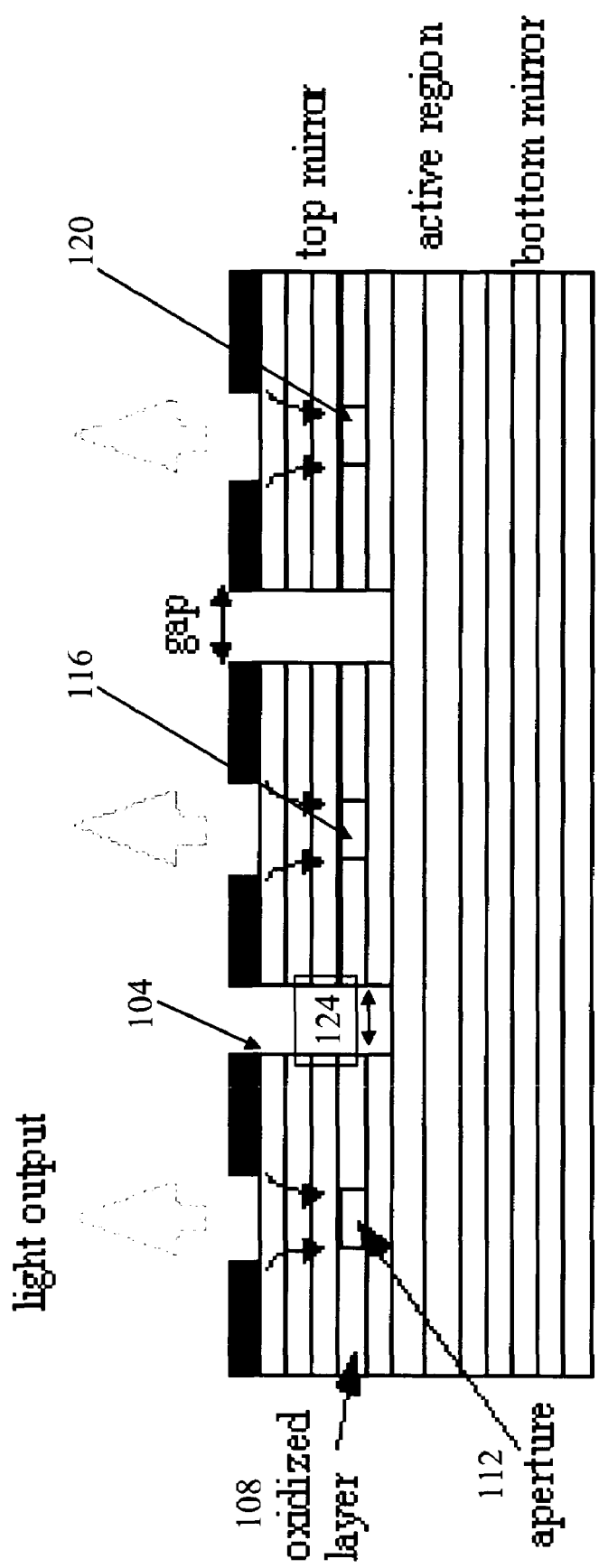
FIG. 1 shows a side view of an etched pillar laterally-oxidized VCSEL structure.

FIG. 1 shows a cross-sectional side view of an oxide-confined VCSEL mesa-structure with an etched pillar structure. Mesa sidewalls 104 provide access to buried aluminum-containing layers 108. Buried layer 108 is selectively oxidized to form laser apertures 112, 116, 120. In typical prior art VCSELs, the edge of the mesa completely surrounds the laser aperture such that an air gap 124 completely separates adjacent laser apertures 112 and 116. The air gap prevents close coupling of optical fields between adjacent lasers.

Using via holes instead of pillars to access the oxidation layers allows much tighter packing of VCSEL structures. U.S. Pat. No. 5,978,408 by Robert Thornton and entitled "Highly Compact Vertical Cavity Surface Emitting Lasers" issued Nov. 2, 1999 and hereby incorporated by reference in its entirety, describes using via holes to access the oxidation layers. The via holes are typically arranged along the corners of a polygon such that upon oxidation, the oxidation fronts originating from each via hole expands and merges with oxidation fronts from adjacent via holes to define a laser aperture at the center of the polygon.

Figure 2:
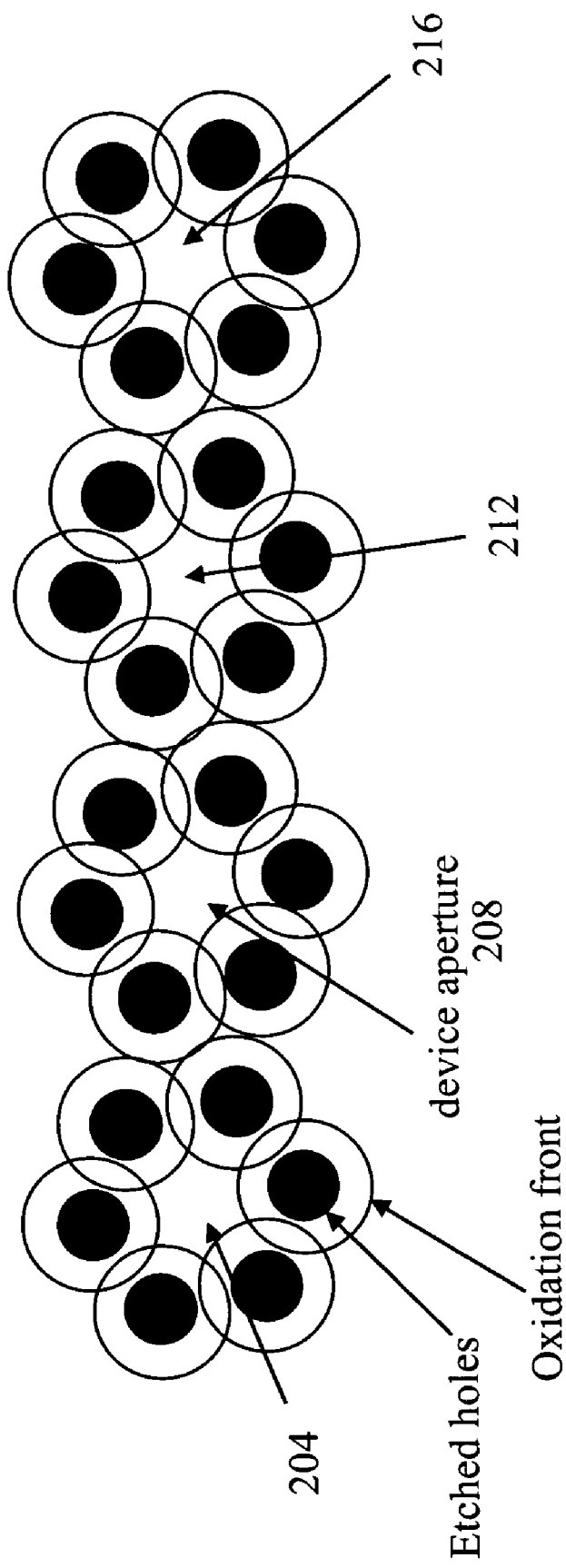
FIG. 2 shows a top view optical micrograph of oxidized VCSEL units used in a phase array.

FIG. 2 shows a top view micrograph of four laser apertures 204, 208, 212, 216. By packing closely adjacent laser apertures and minimizing the material between adjacent laser apertures, high inter-element coupling of the optical output of each VCSEL can be achieved. In order minimize the oxidation layer separating adjacent lasers, the oxidation process is typically terminated before each aperture is completely surrounded by oxidized material.

Figure 3:
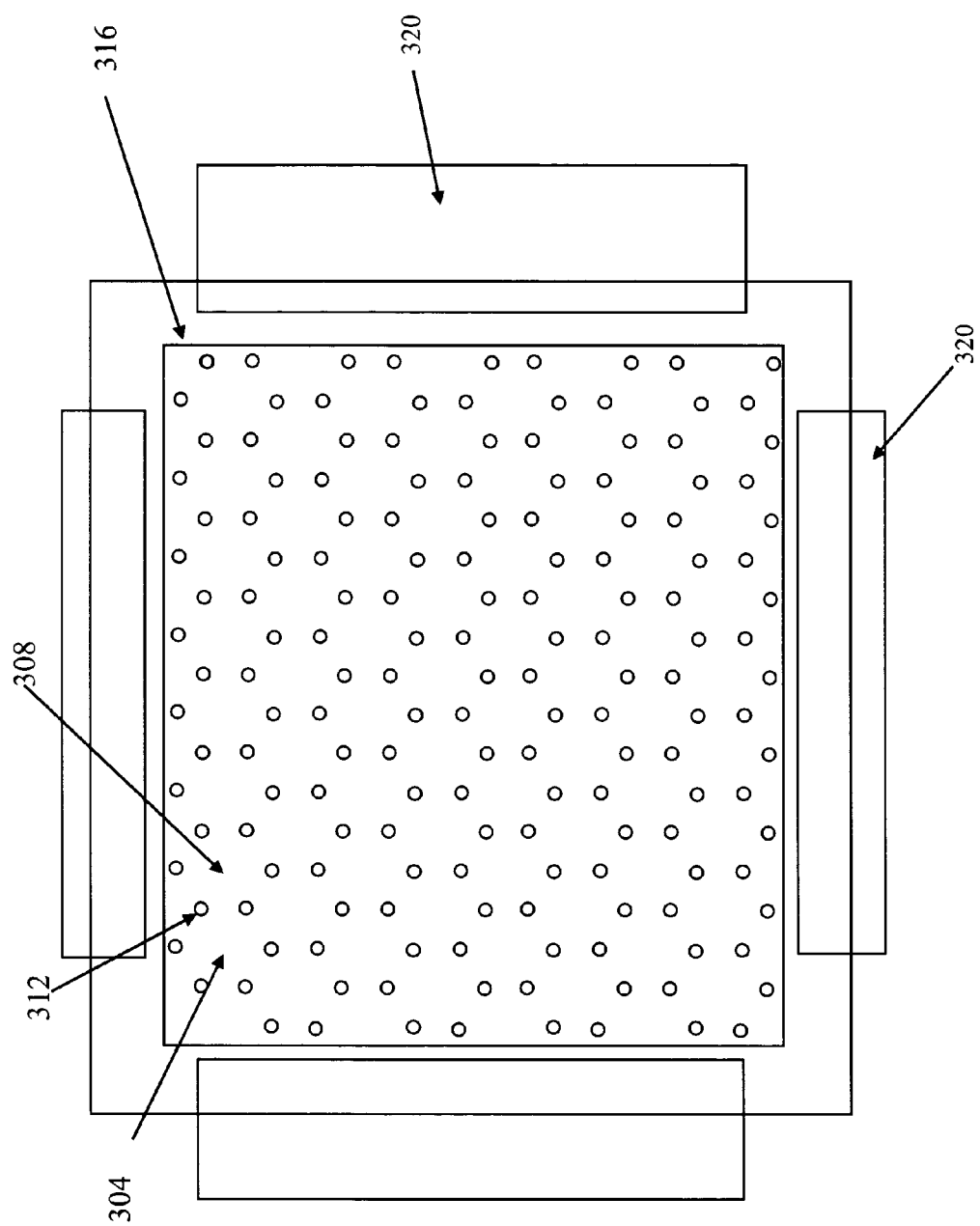
FIG. 3 shows a schematic implementation of an 8×8 laterally-oxidized phase array.

FIG. 3 illustrates adjacent laser aperture regions such as region 304, 308 that share different sections of an oxidation front generated by a common via hole 312. Sharing the oxidation front generated by each via hole increases VCSEL density in a unit area and further enhances mode coupling between neighboring VCSELs. Ideally, sufficient mode coupling induces mode locking between adjacent aperture regions. FIG. 3 shows a 64 VCSEL element structure arranged in an 8×8 rectangular array. In the illustrated embodiment, a transparent indium tin oxide (ITO) electrode 316 covers the entire array. Contacts 320 couple the ITO electrode to a power supply (not shown). The ITO electrode provides an injection current to the laser apertures.

An oxidized material at least partially surrounds each VCSEL in the array. The oxidized material forms a lateral waveguide defining an optical aperture. Limiting the extent of lateral oxidation enhances mode leakage and coupling between adjacent VCSEL laser apertures. For example, assuming an eight micrometer straight line distance between adjacent via holes in the hexagonal structure of FIG. 3, the oxidation extent 314, defined to be the shortest distance from the edge of the via hole to the edge of the oxidation, should preferably be less than 0.5 micrometers. To achieve a 0.5 micrometer oxidation front, a typical oxidation time for $Al_{0.8}Ga_{0.2}As$ is approximately 7 minutes.

The actual spacing between adjacent oxidation fronts defining a laser aperture varies according to a number of factors including the wavelength output by the laser and the effective refractive index within the aperture. In particular, the extent of the evanescent wave that induces mode locking determines the spacing of via holes and the oxidation times. The electromagnetic field strength of an evanescent wave typically decreases as a function of $e^{-z/z_o}$ where z is the distance from the boundary of the aperture and $z_o$ is a characteristic length. This characteristic length is approximately equal to the wavelength of the laser divided by 2pi(sqrt(2(n*f*dn))) where n is the effective refractive index of the aperture, f is the fraction of the oxidized to unoxidized area in the coupling region between array elements, and dn is the effective refractive reduction in the oxidized region detailed computations are provided in an article entitled "Effective index model for vertical-cavity surface-emitting lasers" by G. R. Hadley in Optic Letters, vol. 20, no. 13 pp 1483-1485, 1995 which is hereby incorporated by reference.

A typical VCSEL operates around 850 nm, the effective index of refraction n is approximately 3, and an example effective refractive reduction dn is approximately 0.065. Assuming the structure of FIG. 3 has a lateral oxidation extent of 0.5 micrometers, the characteristic length $z_o$ is approximately 0.87 micrometers. Based on such approximations, a mode interaction length may be computed. The mode interaction length is typically assumed to be approximately five times the characteristic length. However, the mode interaction length may be extended up to approximately ten times the characteristic length by further distancing the oxidation epitaxial layer 150 of FIG. 1 further from the laser active regions 154. Using such parameters, the laser dimensions are adjusted to allow for mode locking between adjacent lasers.

A laser phase array usually operates in higher order supermodes producing two or more radiation lobes existing in the far field. However, single mode operation that concentrates light power in a single radiation lobe is desirable for many applications. In order to achieve single mode operation, one embodiment of the invention blocks or otherwise diminishes the unwanted far field lobes. An alternative embodiment of the invention achieves fundamental supermode operation (with a single radiation lobe in the far field region) by positioning high gain coupling regions between adjacent laser apertures. These high gain coupling regions may have higher gains than the gain found in the actual laser aperture. One method of increasing gain is to increase the conductivity of the coupling regions compared to the conductivity of the laser aperture regions. Higher conductivity increases the current density (more current per unit area) in the high gain coupling regions compared to the laser aperture regions.

One method of increasing the conductivity is to dope the high gain coupling region with a suitable dopant such as zinc. The doping may be done by masking the laser aperture regions and diffusing a suitable dopant into the coupling region. Alternatively, the dopant may be added by direct ion implantation.

It is undesirable for the doped high gain region to emit laser light. In order to prevent lasing in the high gain coupling region, the mirror reflectivity over the coupling region may be reduced. This reduction can be accomplished by, for example, eliminating part or all of the upper mirror layers above the coupling region. In practice, VCSEL wafers can be masked so that upper DBR mirrors in unprotected areas above the coupling region can be selectively etched by, for example, chemically-assisted ion beam etching.

A second method of reducing reflectivity of mirrors above the high gain coupling region is to deposit additional thin film layers on that region. These additional layers reduce reflectivity if they are not specifically designed to phase match the existing mirror layers. Efficient reflectivity reduction occurs when the additional layers are specifically designed as anti-reflection coatings to negate the reflectivity of the DBR layers. Well known anti-reflection design techniques are taught in textbooks such as "Optics" by Hecht and Zajac, 1973, chapter 9.9 which is hereby incorporated by reference.

Still a third method of preventing lasing in the high gain coupling region is to selectively introduce optical loss either in the coupling region itself or in the mirrors above the coupling region. For example, heavy p-type doping in the mirror layers, near the active light-emitting layers enhances free carrier absorption. The higher optical loss decreases cavity quality factor and increases the threshold for lasing in those areas.

Figure 4:
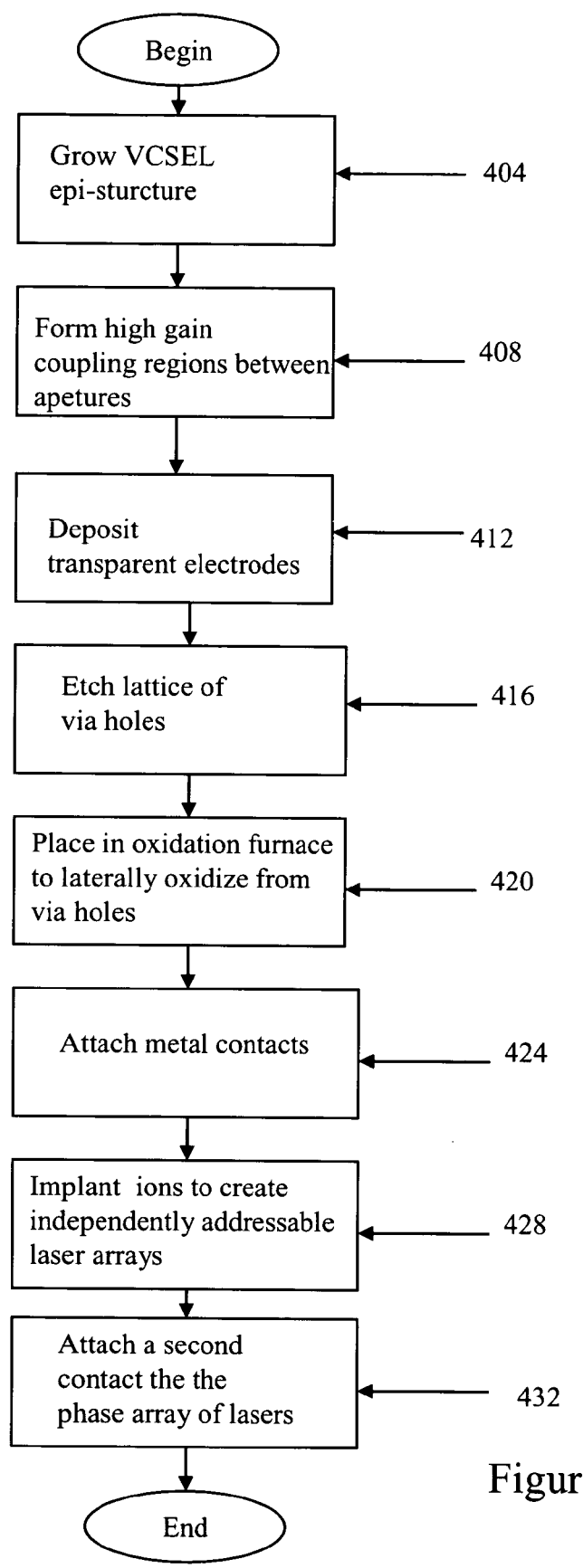
FIG. 4 is a flow chart that describes one method of forming a laterally-oxidized VCSEL phase array.

FIG. 4 is a flow chart that describes one method of fabricating a VCSEL laser phase array. In block 404, a VCSEL epi-structure is grown. An example structure typically includes an n-doped DBR (distributed Bragg reflector stack) followed by an active layer and a p-doped DBR on a substrate. The active layer allows selective oxidation, typically by including a high Al-content in the active layer regions to be oxidized.

Block 408 describes forming high gain coupling regions between apertures. Formation of these coupling regions encourages fundamental supermode operation. As previously described, one method of forming the high gain coupling region includes diffusing a p-dopant such as zinc to increase the conductivity of the coupling region. Masks overlaying the laser aperture controls diffusion of the p-dopant into the coupling region. In one embodiment of the invention, these same masks may be used to allow selective etching of the mirrors above the high gain coupling region as described in block 410. The selective etching reduces mirror reflectivity and prevent lasing in the coupling regions. After use, the masks may be removed.

In block 412, a transparent electrode is deposited over the wafer surface. In one embodiment of the invention, a sputtering process is used to deposit indium tin oxide (ITO) or Zinc Oxide to form a transparent electrode. The transparent electrode simultaneously provides current to several adjacent lasers in the laser array. The transparent electrode may also overlay the high gain coupling regions to provide current, and thus optical gain, into the coupling regions. In one embodiment of the invention, the transparent electrode forms a "blanket" over the entire laser array uniformly injecting current while simultaneously allowing high light output through the transparent electrode. Adjusting the thickness of the transparent electrode to one half the wavelength of light output by the laser array minimizes light reflections by the electrode. After transparent electrode deposition, successive rapid anneals may be performed. A first anneal crystallizes the sputtered transparent electrode material. A second anneal forms an ohmic contact between the transparent electrode and the underlying GaAs material.

After deposition of the transparent electrode, a lattice of via holes are patterned. In block 416, via holes are etched. In one embodiment, a dry etch is used to etch through the transparent electrode and the underlying epi layers exposing the buried oxidizable layer, typically a high aluminum content AlGaAs layer near the active region. The via holes are arranged such that each set of via holes form the verticies of a polygon surrounding each laser aperture.

In order to form oxidized waveguides, the laser array is placed in a wet oxidation furnace to laterally oxidize the buried layer through the via holes as described in block 420. The time and temperature of the oxidation process depends on the oxidation extent. Limiting the oxidation time prevents an oxidation region originating from a via hole from contacting an adjacent oxidation region originating from an adjacent via hole. The unoxidized region remaining between adjacent oxidized regions serves as the high gain coupling regions between adjacent laser apertures. The oxidation regions form the lateral waveguide array.

In block 424, metal contacts are attached. These metal contacts couple the transparent electrode to a power source. In block 428, ion implantation creates insulating regions between adjacent sub-units. Each sub-unit serves as an independently addressable set of phase array lasers. The ion implantation may use a variety of elements such as hydrogen.

In block 432, a second electrode is attached to the phase array of lasers. In one embodiment of the invention, the second electrode is an n-contact metal deposited on the wafer backside.

Figure 5:
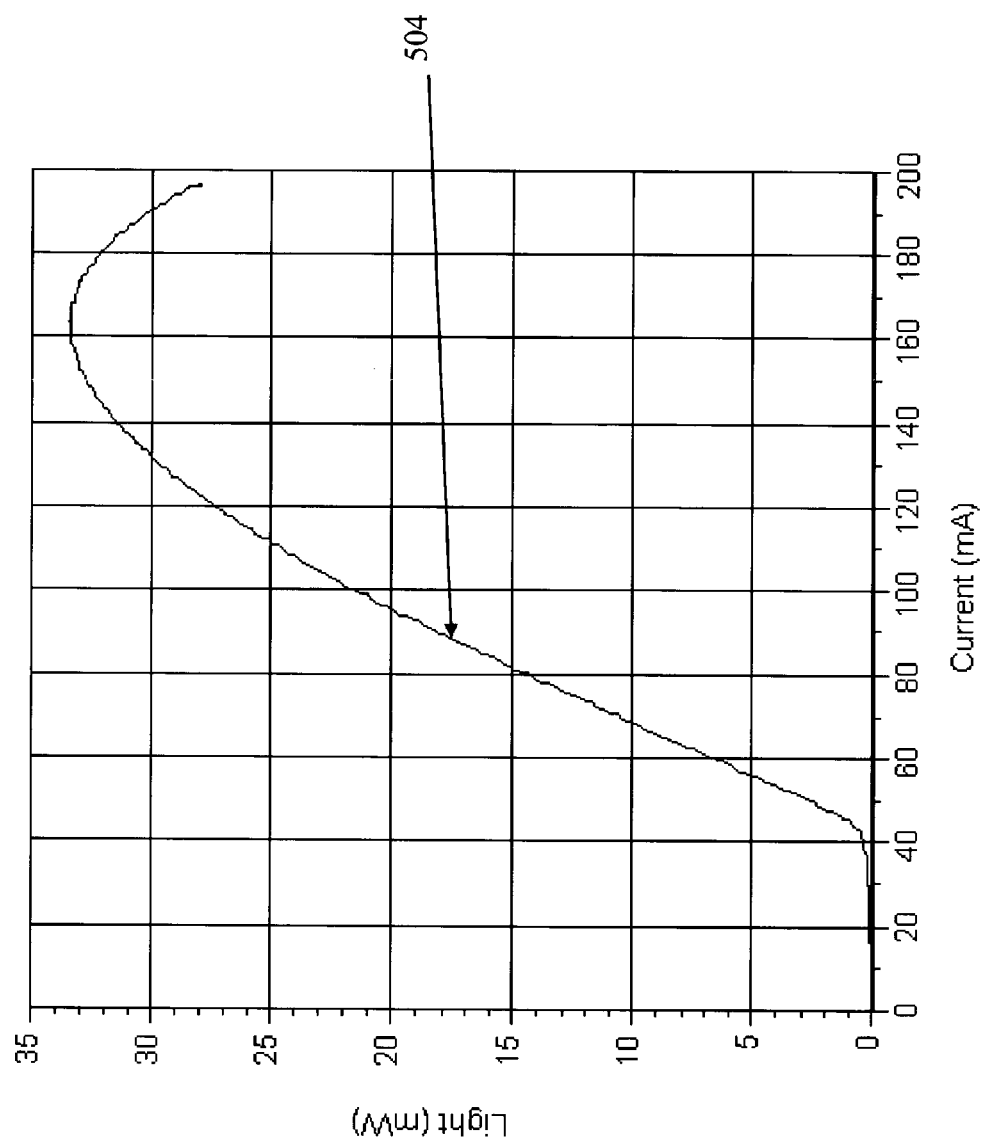
FIG. 5 is a graph that plots the light output of a VCSEL phase array versus an input current.

FIG. 5 shows a room temperature CW light output versus input current curve of a typical 64 element array of VCSELs. Proper heat sinking of the VCSEL array allows generation of significantly higher light output levels at a given current level.

Figure 6:
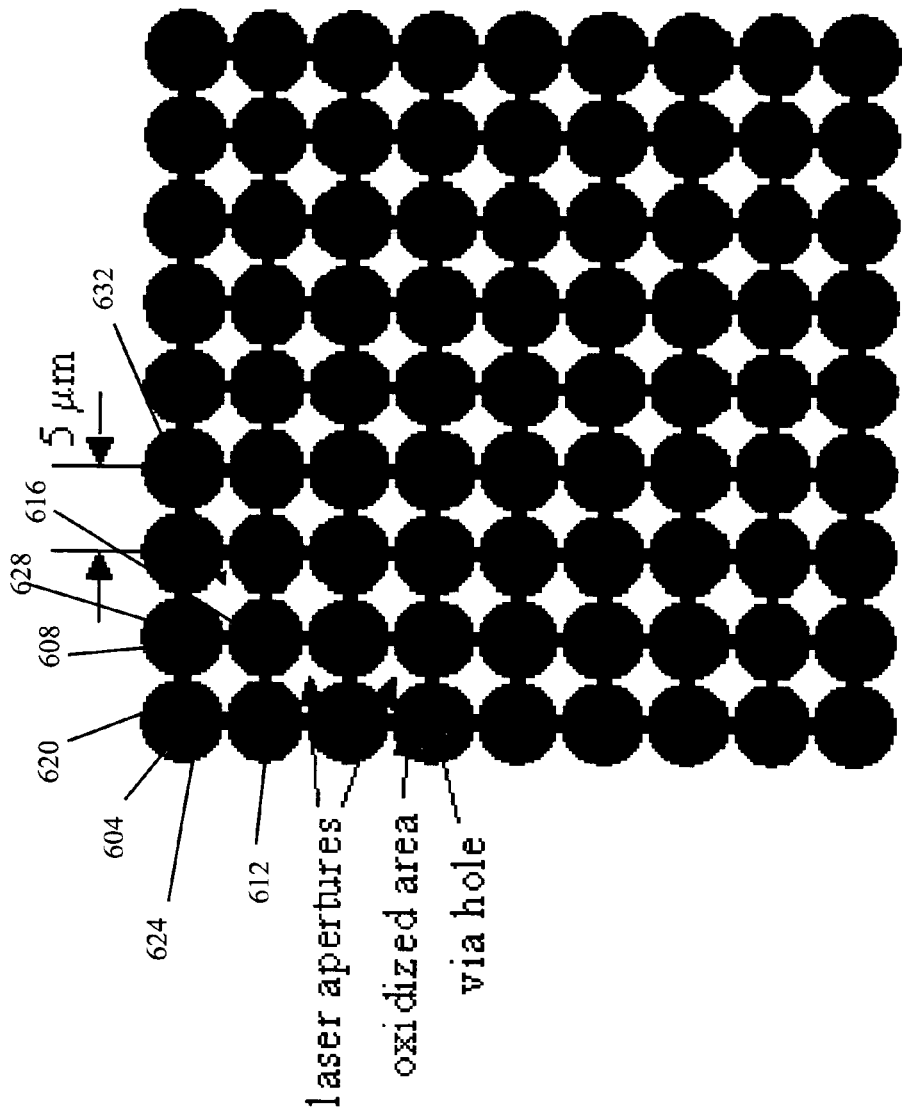
FIG. 6 shows an 8×8 VCSEL phase array design where adjacent via holes from the verticies of a square.

Although FIG. 3 shows a laterally oxidized 8×8 VCSEL phase array structure formed using a hexagonal arrangements of via holes, Alternative arrangements may be used. FIG. 6 shows a higher density of VCSELs formed by using a square or grid arrangement of via holes. Each set of four via holes such as via holes 604, 608, 612, 616 form the verticies of a square polygon that surrounds laser aperture 620. A laterally oxidized region, such as laterally oxidized region 624, surrounds each via hole such as via hole 604. The oxidized region forms the edge of the waveguide surrounding laser aperture 620. Typically, the laterally oxidized regions are made small in extent such that a gap or coupling region 628 exists between adjacent laterally oxidized regions. The coupling region allows mode coupling between adjacent laser apertures such as laser aperture 620 and laser aperture 632.

Figure 7:
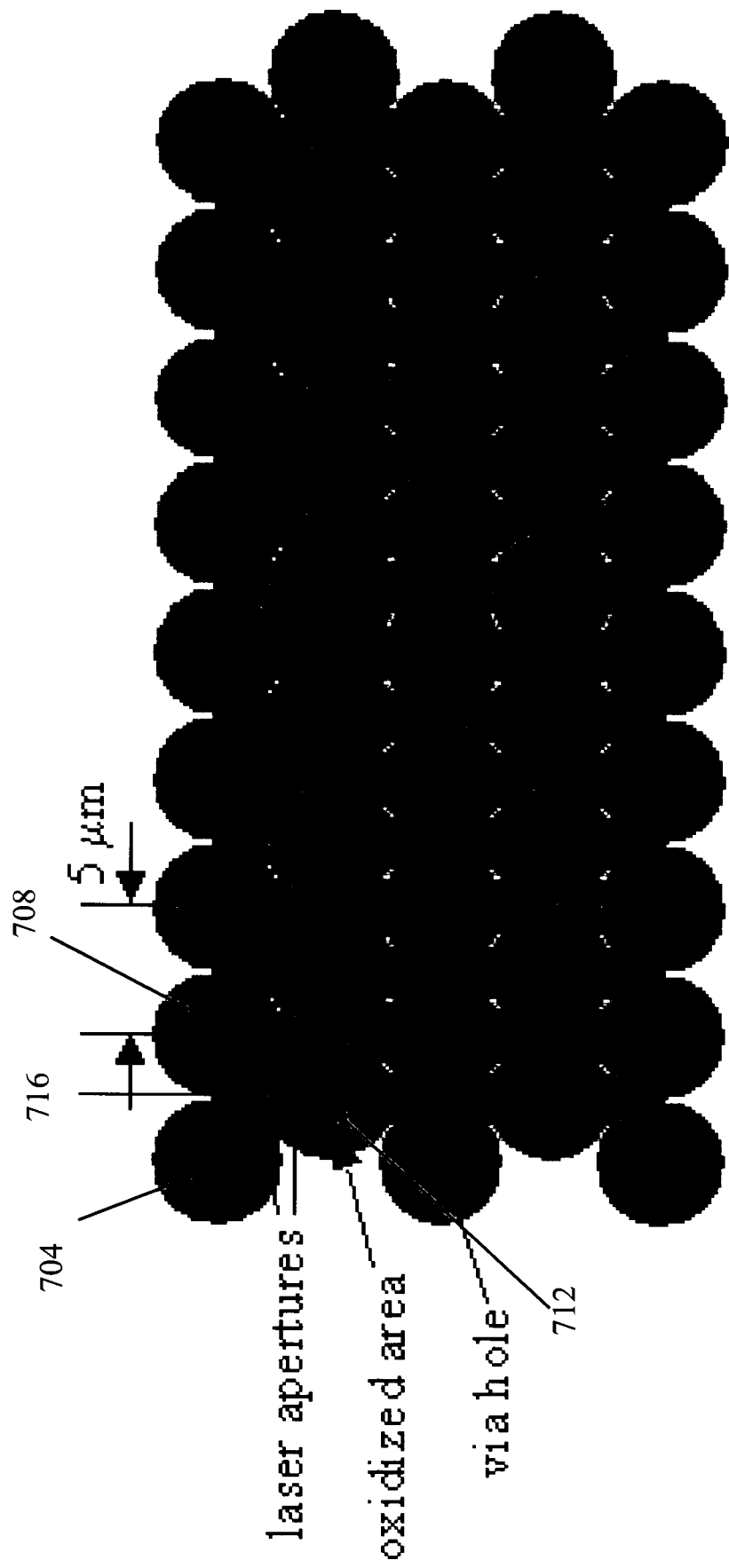
FIG. 7 shows an 8×8 VCSEL phase array design where adjacent via holes form the verticies of a triangle.

FIG. 7 shows an alternative, compact arrangement of a laterally oxidized 8×8 VCSEL phase array design that utilizes a triangular device geometry. In FIG. 7, three via holes, such as via holes 704, 708, 712 form the verticies of a triangle polygon that surrounds a corresponding laser aperture such as laser aperture 716. A laterally oxidized region, such as oxidized region 720 surrounds each via hole. As in the structure of FIG. 6, the laterally oxidized regions form a waveguide for each laser aperture. In the embodiment of FIG. 7, adjacent oxidized regions contact, for example oxidized region 820 contacts oxidized region 824, resulting in reduced mode coupling between adjacent laser apertures.

Figure 8:
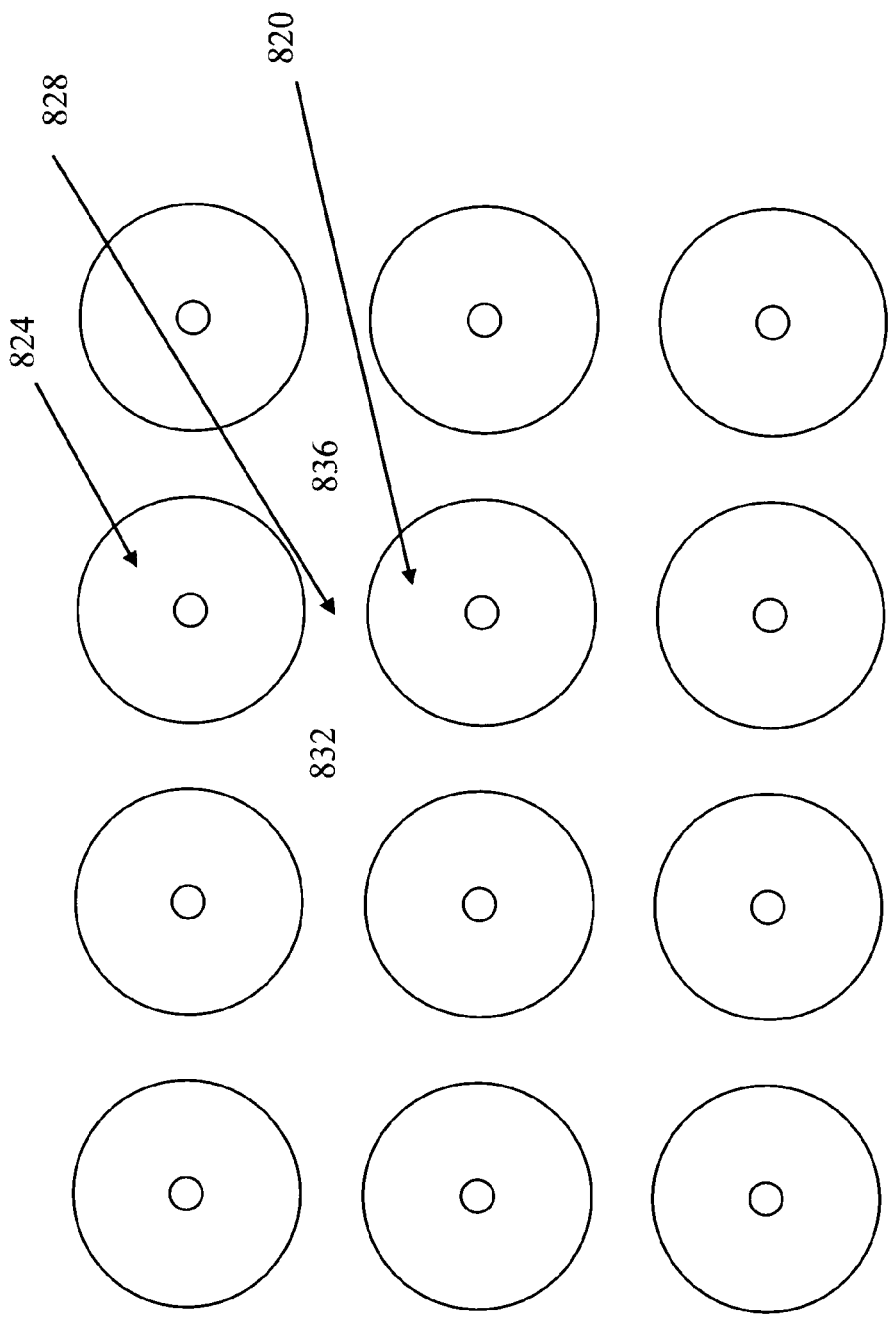
FIG. 8 shows a VCSEL phase array design where the extent of oxidation has been reduced to allow high gain coupling regions between adjacent laser apertures.

FIG. 8 shows a structure similar to the structure of FIG. 7 except that high gain regions such as high gain region 828 separate adjacent oxidized regions, such as oxidized regions 820 and 824. Thus in the structure of FIG. 8, each oxidized region includes only one corresponding via hole such that high gain regions and laser apertures completely surround each oxidized region. In other words, an oxidized region originating from a first via hole does not contact an adjacent oxidized region originating from an adjacent via hole. The high gain region, such as high gain region 828, couples adjacent laser apertures and allows significant mode coupling between adjacent laser apertures, such as laser apertures 832 and 836.

Although a number of details and examples of various structures have been provided, it should be understood that the foregoing description is intended to be illustrative of the invention. Variations and modification of the descriptions provided herein will present themselves to those skilled in the art. For example, the provided detailed description has identified example dimensions, particular VCSEL structures, materials used, oxidation extents, and time periods used in fabrication. However, other methods, other materials and different oxidation extents may also be used. Accordingly, the present description should not be read as limiting the scope of the invention except as described in the claims that follow.

What is claimed is:

1. An array of vertical cavity surface emitting lasers (VCSELs) comprising:
a first VCSEL including a first laser aperture partially bounded by an oxidized semiconductor material forming a first oxide wall, the first oxide wall including a an opening in the first oxide wall;
a second VCSEL positioned adjacent to the first VCSEL, the second VCSEL including a second laser aperture partially bounded by oxidized semiconductor material forming a second oxide wall, the second oxide wall including an opening in the second oxide wall; and,
a ground contact coupled to a first side of the first VCSEL and the second VCSEL and a top contact coupled to a second side of the first VCSEL and the second VCSEL to simultaneously provide current to the first VCSEL and the second VCSEL, the first VCSEL and the second VCSEL closely packed such that when the top contact simultaneously provides current to the first VCSEL and the second VCSEL, the openings in the first oxide wall and the second oxide wall are sufficiently large that evanescent fields output by the first VCSEL causes mode coupling between the first VCSEL and the second VCSEL.

2. The structure of claim 1 further comprising:
a high gain coupling region coupling the first laser aperture to the second laser aperture such that the output light modes of the first laser aperture and the second laser aperture are phase coupled.

3. The structure of claim 2 wherein the top contact provides current to the high gain coupling region.

4. The structure of claim 2 wherein the gain of the high gain coupling region is higher than the gain of the first laser aperture.

5. The structure of claim 1 wherein the top contact is formed from a transparent conductor.

6. The structure of claim 5 wherein light output by the first laser aperture passes through the transparent conductor, the transparent conductor to also provide current to a high gain coupling region in the opening between the first oxide wall.

7. The structure of claim 1 wherein the first laser aperture is completely surrounded by oxidized semiconductor material.

8. The structure of claim 1 wherein an unoxidized opening in the first oxide wall bounding the first laser aperture coincides with a corresponding opening in the second oxide wall bounding the second laser aperture such that during operation, electromagnetic radiation from the first laser couples to the second laser inducing mode coupling between the first laser and the second laser.

9. The structure of claim 1 wherein the first oxide wall bounding the first laser aperture includes a plurality of via holes, the first oxide wall formed by lateral oxidation from the plurality of via holes.

10. The structure of claim 1 wherein the first oxide wall and the second oxide wall merge together in a section, the merged together section separating the first laser aperture from the second laser aperture.

11. The structure of claim 1 wherein the first oxide wall bounding the first laser aperture and the second oxide wall bounding the second laser aperture are both formed from a plurality of via holes, the first oxide wall and the second oxide wall formed by lateral oxidation from the plurality of via holes.

12. The array of claim 1 further comprising:
a high gain coupling region formed by heavily doping the substrate in the at least one opening in the first oxide wall and the corresponding opening in the second oxide wall.

13. The array of claim 1 wherein the contact to simultaneously provide current is a single common contact.

14. An array of vertical cavity surface emitting lasers (VCSELs) comprising:
a first VCSEL including a first laser aperture, the first laser partially surrounded by a first oxide wall and at least an opening in the first oxide wall;
a second VCSEL positioned adjacent to the first VCSEL, the second VCSEL including a second laser aperture partially surrounded by a second oxide wall and an opening in the second oxide wall, the opening in the first oxide wall and the opening in the second oxide wall aligned to facilitate evanescent fields from the first VCSEL to interact with an active region of the second VCSEL and thereby cause mode coupling between the first VCSEL and the second VCSEL, and, a p-side contact that contacts both the first VCSEL and the second VCSEL the p-side contact to simultaneously provide current to the first VCSEL and the second VCSEL, wherein a third VCSEL positioned adjacent to the first VCSEL, the third VCSEL including a third laser aperture partially surrounded by a third oxide wall and an opening in the third oxide wall, a second opening in the first oxide wall and the opening in the third oxide wall aligned to allow evanescent fields from the first VCSEL to reach an active region of the third VCSEL.

15. The array of claim 14 further comprising:
a high gain coupling region that including a high gain region coupling the at least one opening in the first oxide wall to the corresponding opening in the second oxide wall.

16. The array of claim 15 further comprising:
a contact coupled to the first VCSEL and the second VCSEL, the contact to simultaneously pump current through the first VCSEL and the second VCSEL.

17. The array of claim 14 further comprising:
a single contact to simultaneously provide power to the first VCSEL, the second VCSEL and the third VCSEL.

18. An array of vertical cavity surface emitting lasers (VCSELs) comprising:
a first VCSEL including a first laser aperture, the first laser partially surrounded by a first oxide wall and at least an opening in the first oxide wall;
a second VCSEL positioned adjacent to the first VCSEL, the second VCSEL including a second laser aperture partially surrounded by a second oxide wall and an opening in the second oxide wall, the opening in the first oxide wall and the opening in the second oxide wall aligned to facilitate evanescent fields from the first VCSEL to interact with an active region of the second VCSEL;
a contact coupled to the first VCSEL and the second VCSEL, the contact to simultaneously pump current through the first VCSEL and the second VCSEL;
a high gain coupling region that including a high gain region coupling the at least one opening in the first oxide wall to the corresponding opening in the second oxide wall, the high gain coupling region also coupled to said contact such that said contact provides current to the high gain coupling region thereby facilitating mode coupling between the first VCSEL and the second VCSEL.

19. An array of vertical cavity surface emitting lasers (VCSELs) comprising:
a first VCSEL including a first laser aperture, the first laser partially surrounded by a first oxide wall and at least an opening in the first oxide wall;
a second VCSEL positioned adjacent to the first VCSEL, the second VCSEL including a second laser aperture partially surrounded by a second oxide wall and an opening in the second oxide wall, the opening in the first oxide wall and the opening in the second oxide wall aligned to facilitate evanescent fields from the first VCSEL to interact with an active region of the second VCSEL;
a third VCSEL positioned adjacent to the first VCSEL, the third VCSEL including a third laser aperture partially surrounded by a third oxide wall and an opening in the third oxide wall, a second opening in the first oxide wall and the opening in the third oxide wall aligned to allow evanescent fields from the first VCSEL to reach an active region of the third VCSEL,
a plurality of high gain coupling regions including a first high gain region coupling the at least one opening in the first oxide wall to the corresponding opening in the second oxide wall and a second high gain region coupling the second opening in the first oxide wall to the corresponding opening in the third oxide wall.

20. The array of claim 19 further comprising:
a single contact to simultaneously provide power to the first VCSEL, the second VCSEL, the third VCSEL and the plurality of high gain coupling regions.

21. A method of forming an array of VCSELs comprising the operations of:
forming a plurality of via holes in a substrate;
laterally oxidizing the substrate to form a first oxide wall partially surrounding a first laser aperture and a second oxide wall partially surrounding a second laser aperture, the first oxide wall and the second oxide wall having openings of sufficient size such that evanescent fields from the first laser aperture will induce mode locking between the first laser aperture and the second laser aperture; and,
forming a top contact over the substrate, the top contact in conjunction with a second bottom contact to provide current simultaneously to the first laser aperture and the second laser aperture.

22. The method of claim 21 wherein lateral oxidation extent is controlled such that lateral oxidation fronts that originate from a first via hole does not contact the lateral oxidation fronts that originate from adjacent via holes.

23. The method of claim 22 wherein the region between adjacent via holes is heavily doped to form a high gain coupling region between the first laser aperture and the second laser aperture.

24. The method of claim 21 further comprising the operation of depositing a single contact above the first laser aperture and the second laser aperture.

25. An array of vertical cavity surface emitting lasers (VCSELs) comprising:
   a first VCSEL including a first laser aperture partially bounded by an oxidized semiconductor material forming a first oxide wall, the first oxide wall including an opening in the first oxide wall;
   a second VCSEL positioned adjacent to the first VCSEL, the second VCSEL including a second laser aperture at least partially bounded by oxidized semiconductor material forming a second oxide wall, the second oxide wall including an opening in the second oxide wall; and,
   a high gain region positioned in the opening in the first oxide wall between the first VCSEL and the second VCSEL, the high gain region to receive current and thereby enhance mode coupling between the first VCSEL and the second VCSEL.

26. The array of claim 25 wherein the high gain is achieved by heavily doping the substrate to reduce the conductivity of the high gain region.

27. The array of claim 25 further comprising:
   a reflecting structure over the high gain region, the reflecting structure modified such that the reflectivity of the reflecting structure over the high gain region is reduced to avoid lasing in the high gain region.

28. The array of claim 27 wherein the reflecting structure is a distributed Bragg reflecting mirror, and the mirror over the high gain region is selectively etched to reduce reflectivity.

29. The array of claim 27 wherein a thin layer is added to the reflecting structure to change the phase matching properties to reduce reflectivity of the reflecting structure over the high gain region.

30. The array of claim 25 further comprising:
   a high loss region formed o0ver the high gain region to decrease cavity quality factor and increase the threshold for lasing.

31. The array of claim 30 wherein the high loss region is formed by heavy p-type doping in a mirror layer over the high gain region.

* * * * *